US009070328B2

(12) United States Patent
Derichs

(10) Patent No.: US 9,070,328 B2
(45) Date of Patent: Jun. 30, 2015

(54) ADDRESS-SELECTABLE CHARGING OF CAPACITIVE DEVICES

(75) Inventor: Kevin J. Derichs, The Woodlands, TX (US)

(73) Assignee: UNIPIXEL DISPLAYS, INC., The Woodlands, TX (US)

( * ) Notice: Subject to any disclaimer, the term of this patent is extended or adjusted under 35 U.S.C. 154(b) by 691 days.

(21) Appl. No.: 13/509,175

(22) PCT Filed: Nov. 5, 2010

(86) PCT No.: PCT/US2010/055564
§ 371 (c)(1),
(2), (4) Date: May 10, 2012

(87) PCT Pub. No.: WO2011/059886
PCT Pub. Date: May 19, 2011

(65) Prior Publication Data

US 2012/0223683 A1 Sep. 6, 2012

Related U.S. Application Data

(60) Provisional application No. 61/261,454, filed on Nov. 16, 2009.

(51) Int. Cl.
*H03B 1/00* (2006.01)
*G09G 3/34* (2006.01)
*G09G 3/36* (2006.01)

(52) U.S. Cl.
CPC .............. *G09G 3/346* (2013.01); *G09G 3/3648* (2013.01); *G09G 2300/0439* (2013.01); *G09G 2310/06* (2013.01)

(58) Field of Classification Search
None
See application file for complete search history.

(56) References Cited

U.S. PATENT DOCUMENTS 531,949 A 1/1895 Kendall
6,140,993 A 10/2000 Pathak et al.
7,042,618 B2 5/2006 Selbrede et al.
7,057,790 B2 6/2006 Selbrede
7,092,146 B2 8/2006 Kim et al.
7,199,397 B2 4/2007 Huang et al.

(Continued)

FOREIGN PATENT DOCUMENTS

JP 6426822 1/1989
JP 200653539 2/2006

(Continued)

OTHER PUBLICATIONS

International Application No. PCT/US2010/055564, Search Report and Written Opinion dated Jun. 3, 2011, 6 pages.

*Primary Examiner* — Long Nguyen
(74) *Attorney, Agent, or Firm* — Conley Rose, P.C.

(57) ABSTRACT

A drive circuit for a capacitive device that comprises a first operational state and a second operational state. The drive circuit comprises a capacitor and preferably two or more transistors. The capacitive device is caused to transition from a first operational state to a second operational state by a row pulse being asserted on a row line and a column pulse asserted on a column enable signal commensurate with the assertion of the row pulse. If the column pulse is deasserted before the row pulse is deasserted, the capacitive device is caused to transition from the first operational state to the second operational upon deassertion of the row pulse. In some embodiments, a precisely controlled variable voltage can be applied to the capacitive device.

13 Claims, 6 Drawing Sheets

(56) References Cited

U.S. PATENT DOCUMENTS

| | | | |
|---|---|---|---|
| 7,218,437 B2 | 5/2007 | Selbrede | |
| 7,274,136 B2 | 9/2007 | DiSanto et al. | |
| 7,755,591 B2 * | 7/2010 | Yeh | 345/100 |
| 7,995,009 B2 * | 8/2011 | Umezaki | 345/82 |
| 2007/0172171 A1 | 7/2007 | Van Ostrand et al. | |
| 2007/0242334 A1 | 10/2007 | Selbrede et al. | |
| 2009/0290116 A1 | 11/2009 | Koike et al. | |

FOREIGN PATENT DOCUMENTS

| | | |
|---|---|---|
| TW | 09913970 | 11/2010 |
| WO | 2011059886 A2 | 5/2011 |
| WO | 2011059886 A3 | 5/2011 |

* cited by examiner

ADDRESS-SELECTABLE CHARGING OF CAPACITIVE DEVICES

TECHNICAL FIELD TO WHICH THE INVENTION RELATES

The present disclosure relates to capacitive devices, and in particular, to address-selectable charging of capacitive devices.

BACKGROUND

Some types of devices are capacitive in nature and can be controlled by an applied voltage. Some such devices have a moving part, such as a membrane, that is in one mechanical state until a voltage threshold is exceeded at which time the moving part moves to a second mechanical state. Examples of such capacitive devices include Micro-Electro-Mechanical System (MEMS) devices. In some applications, capacitive devices are arranged in an array and are addressed and controlled by a combination of row and column signal lines.

CONTENT OF THE INVENTION

The present disclosure relates to a drive circuit for a capacitive device.

In some embodiments, a drive circuit for a capacitive device that comprises a first operational state and a second operational state is disclosed. Said drive circuit comprises: a first transistor having a gate, a drain, and a source, wherein said gate is coupled to a row line, and one of said source and drain is coupled to a column line; a capacitor having a first terminal and a second terminal, wherein said first conductive terminal is coupled to the row line and the second conductive terminal couples to the other of the first transistor's source and drain and also is coupled to the capacitive device; and a second transistor having a gate, a drain and a source, wherein one of said second transistor's drain and source is coupled to said column line, and wherein said second transistor's gate is configured to receive a column enable signal to control said second transistor; wherein the capacitive device is caused to transition from the first operational state to the second operational state by a row pulse being asserted on the row line and a column pulse asserted on the column enable signal commensurate with the assertion of the row pulse, said column pulse deasserted before the row pulse is deasserted, wherein said capacitive device is caused to transition from the first operational state to the second operational upon deassertion of the row pulse.

In some further embodiments, a drive circuit for a capacitive device that comprises a first operational state and a second operational state is disclosed. Said drive circuit comprises: a first transistor having a gate, a drain, and a source, wherein said gate is coupled to a row line, and one of said source and drain is coupled to a column line; a capacitor having a first terminal and a second terminal, wherein said first conductive terminal is coupled to the row line and the second conductive terminal couples to the other of the first transistor's source and drain and also is coupled to the capacitive device; and a transistor circuit coupled to said column line, said transistor circuit comprising a second transistor and a third transistor, each of the second and third transistors having a gate, a drain, and a source; wherein one of the drain and source of the second transistor is tied to a first voltage and one of the drain and source of the third transistor is tied to a second voltage that is different than the first voltage, and the second transistor's gate is configured to receive a first column enable signal and said third transistor's gate is configured to receive a second column enable signal; wherein a variable voltage between said first and second voltage is caused to be applied to one terminal of said capacitive device, said variable voltage is a function of at least the relative timing of failing edges of said first and second column enable signals and a failing edge of a row pulse on said row line.

In some additional embodiments, a drive circuit for a capacitive device that comprises a first operational state and a second operational state is disclosed. Said drive circuit comprises: a first transistor having a gate, a drain, and a source, wherein said gate is coupled to a row line; a second transistor having a gate, a drain and a source, wherein one of said second transistor's drain and source is coupled to one of the source and drain of the first transistor thereby coupling the first and second transistors in series, and wherein the gate of the second transistor is coupled to said column line; a capacitor having a first terminal and a second terminal, wherein said first conductive terminal is coupled to the row line and the second conductive terminal couples to the other of the second transistor's source and drain and also is coupled to the capacitive device; and wherein the capacitive device is caused to transition from the first operational state to the second operational state by a row pulse being asserted on the row line and a column pulse asserted on the column enable signal commensurate with the assertion of the row pulse, said column pulse deasserted before the row pulse is deasserted, wherein said capacitive device is caused to transition from the first operational state to the second operational upon deassertion of the row pulse.

BRIEF DESCRIPTION OF THE DRAWINGS

For a detailed description of exemplary embodiments of the invention, reference will now be made to the accompanying drawings in which.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

The term "connect" or "connected" refers to a direct electrical connection between two electrical components, that is, no intervening electrical components are present. The term "couple" or "coupled" is a broader term that refers to a direct or indirect electrical connection between two components, The embodiments described herein include one or more transistors that are controlled via signal on their gate terminals. In some embodiments depending on the type of transistor used, a high gate signal turns the transistor on. For other types of transistors, a low gate signal turns the transistor on. Either type of transistor can be used in the circuits described herein.

Figure 1:
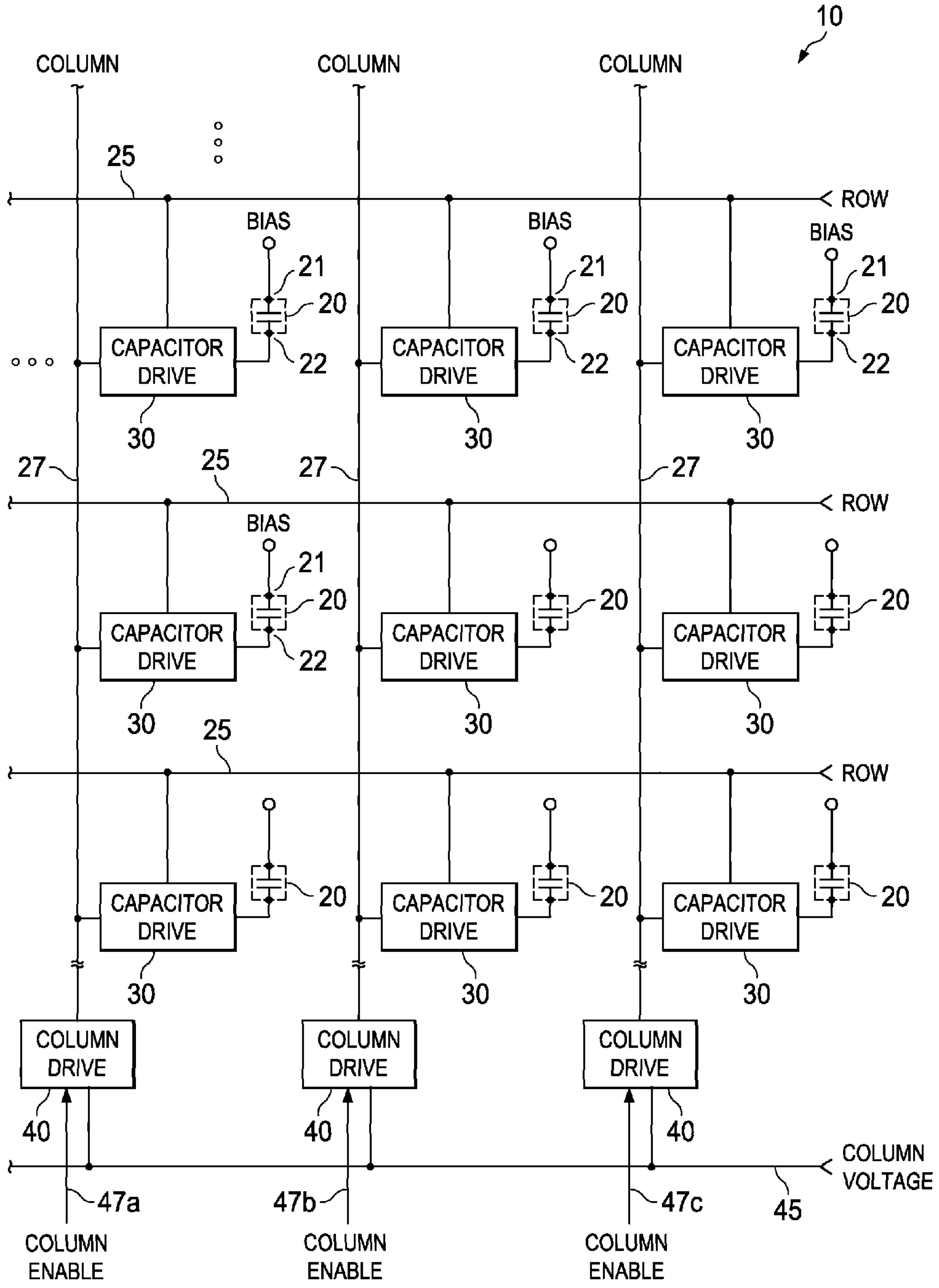
FIG. 1 shows a system comprising multiple capacitive devices in accordance with an embodiment of the invention.

FIG. 1 illustrates a system comprising a plurality of capacitive devices 20 arranged in an array as shown. Each capacitive device 20 is associated with a separate capacitor drive circuit 30. Each capacitor drive circuit 30 connects to a row line 25 and a column line 27. In some embodiments, a voltage is placed on one row line 25 at a time to address one or more of the capacitive devices 20 on that particular row line. The row voltage is generated by logic (not shown).

Each column line 27 is driven by a column drive circuit 40. Each column drive circuit 40 receives a COLUMN VOLTAGE 45 and a separate COLUMN ENABLE signal 47*a-c* as shown. Each COLUMN ENABLE signal 47*n* is controlled by logic (not shown). That is, one column drive circuit 40 can be asserted by its own COLUMN ENABLE signal 47*n* while another column drive circuit 40 is not asserted by its COLUMN ENABLE signal.

Each capacitive device 20 comprises a device that can transition between at least two operational states. In some embodiments, a capacitive device is a device that can respond electro-mechanically, electro-optically, and/or electro-chemically to an applied voltage. In the case of an electro-mechanical capacitive device, for example, each capacitive device 20 comprises one or more components such as conductive membranes that can move. For example, each such capacitive device may comprise a Micro-Electro-Mechanical System (MEMS) device. Such devices can be used in a variety of ways such as optical shutters and MEMS data routing switches. The mechanical states may comprise a closed position and an open position, an off position and an on position, a non-operative state and an operative state, etc. In some embodiments, the portion of the capacitive device that can move (e.g., the membrane) moves from one position to another under the influence of a sufficiently large voltage differential applied to the capacitive device terminals. The capacitive device 20 is said to transition or move between mechanical states even though only a portion of the device physically experiences any movement. In at least some embodiments, each capacitive device 20 changes from one mechanical state to another once the voltage across the device exceeds a particular threshold. However, once the voltage drops below that threshold, or a lower threshold (hysteresis), the device reverts back to its original mechanical state. In other embodiments, the capacitive device may include a liquid crystal that is caused to twist in proportion to the magnitude of an applied voltage. The various electro-mechanical, electro-chemical, and electro-optical states of capacitive device 20 are referred to herein as "operational states."

In the embodiment of FIG. 1, each capacitive device has two terminals 21 and 22. Terminal 21 connects to a BIAS voltage and terminal 22 connects to the capacitor drive circuit 30. For a given capacitive device 20, the combination of that capacitive device's capacitor drive circuit 30 and the column drive circuit 40 for the column to which that capacitor drive, circuit 30 connects forms a capacitor selection circuit that controls the voltage applied to, and thus the operational state of, an associated capacitive device 20.

First Embodiment of Capacitor Selection Circuit

Figure 2:
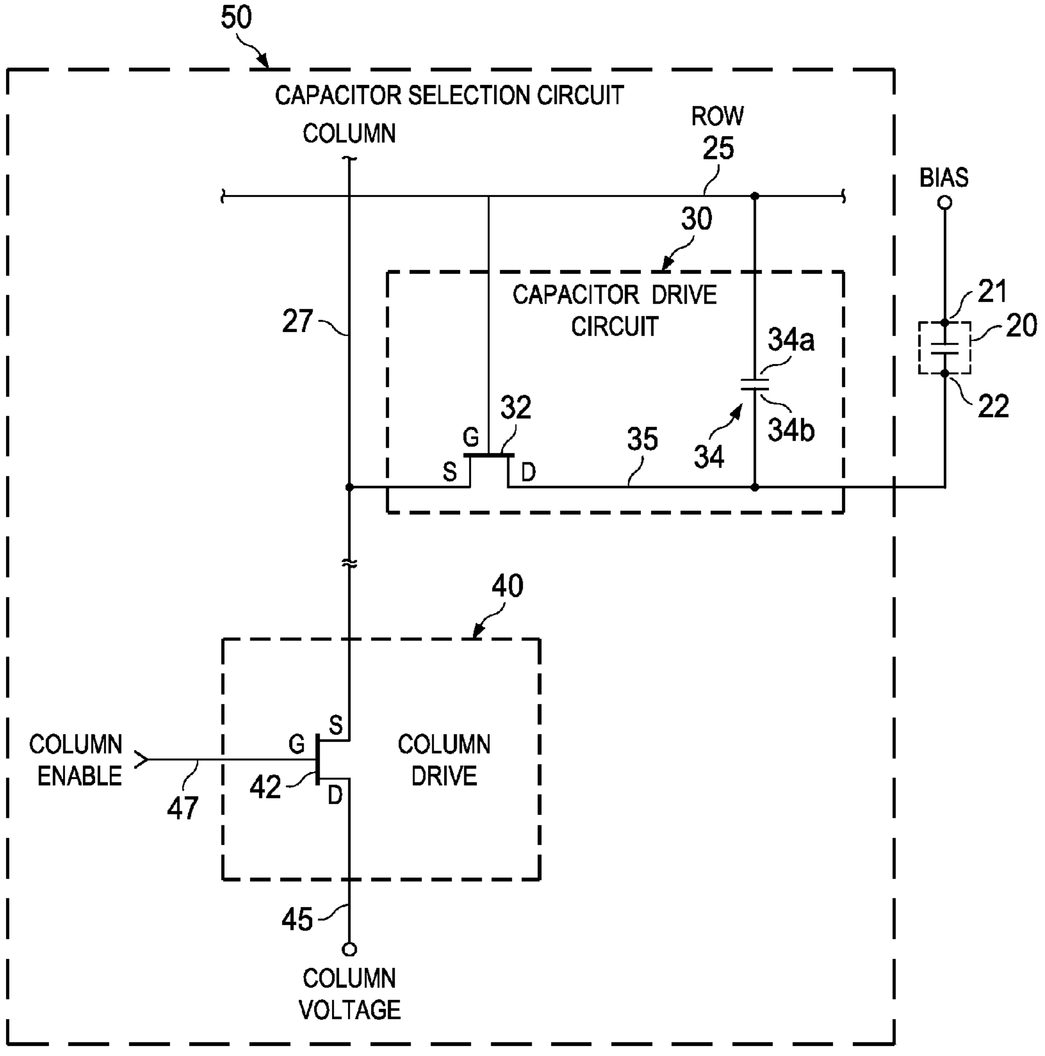
FIG. 2 shows a drive circuit for driving each capacitive device in accordance with a preferred embodiment of the invention.

FIG. 2, for example, depicts an embodiment of a capacitor selection circuit 50 as comprising a capacitor drive circuit 30 for a given capacitive device 20 and a column drive circuit 40 for the column. The capacitor drive circuit 30 comprises a transistor 32 and a capacitor 34. In some embodiments, capacitor 34 is a physically separate device, while in other embodiments, capacitor 34 is formed by the physical overlap of row line 25 over node 22 of capacitive device 20. The transistor 32 may be any of a variety of bi-directional current flow transistors such as a field effect transistor (FET). In some embodiments, the transistor 32 is a thin film transistor (TFT). The gate (G) of transistor 32 is connected to the row line 25. The other two terminals of transistor 32 include a source (S) and a drain (D). In the example of FIG. 2, the drain (D) of transistor 32 connects to one terminal of capacitor 34 (terminal 34*b*) and also to terminal 22 of the capacitive device 20. This connection point is labeled as node 35 in FIG. 2. The other terminal of capacitor 34 (terminal 34*a*) connects to the row line 25.

Normally, the row line 25 is forced to a low voltage (e.g., ground) insufficient to turn on transistor 32. When the voltage on the row line 25 is pulled high, transistor 32 turns on.

In the embodiment of FIG. 2, the column drive circuit 40 preferably comprises a single transistor 42 which may be a FET (e.g., a TFT). The source (S) of transistor 42 connects to the column line 27. The drain (D) of transistor 42 is tied to a predetermined COLUMN VOLTAGE 45. In some embodiments, COLUMN VOLTAGE 45 may be a ground potential (0 V), but can be other than ground in other embodiments.

The gate (G) of transistor 42 receives the COLUMN ENABLE signal 47. In the embodiment of FIG. 2, when the COLUMN ENABLE signal 47 is low, the transistor 42 is off (not conducting between its drain and source). When transistors 32 and 42 are off, the column line 27 floats. A high COLUMN ENABLE signal 47 turns on transistor 42 and forces the column line 27 to the COLUMN VOLTAGE 45 (e.g., ground).

Figure 3:
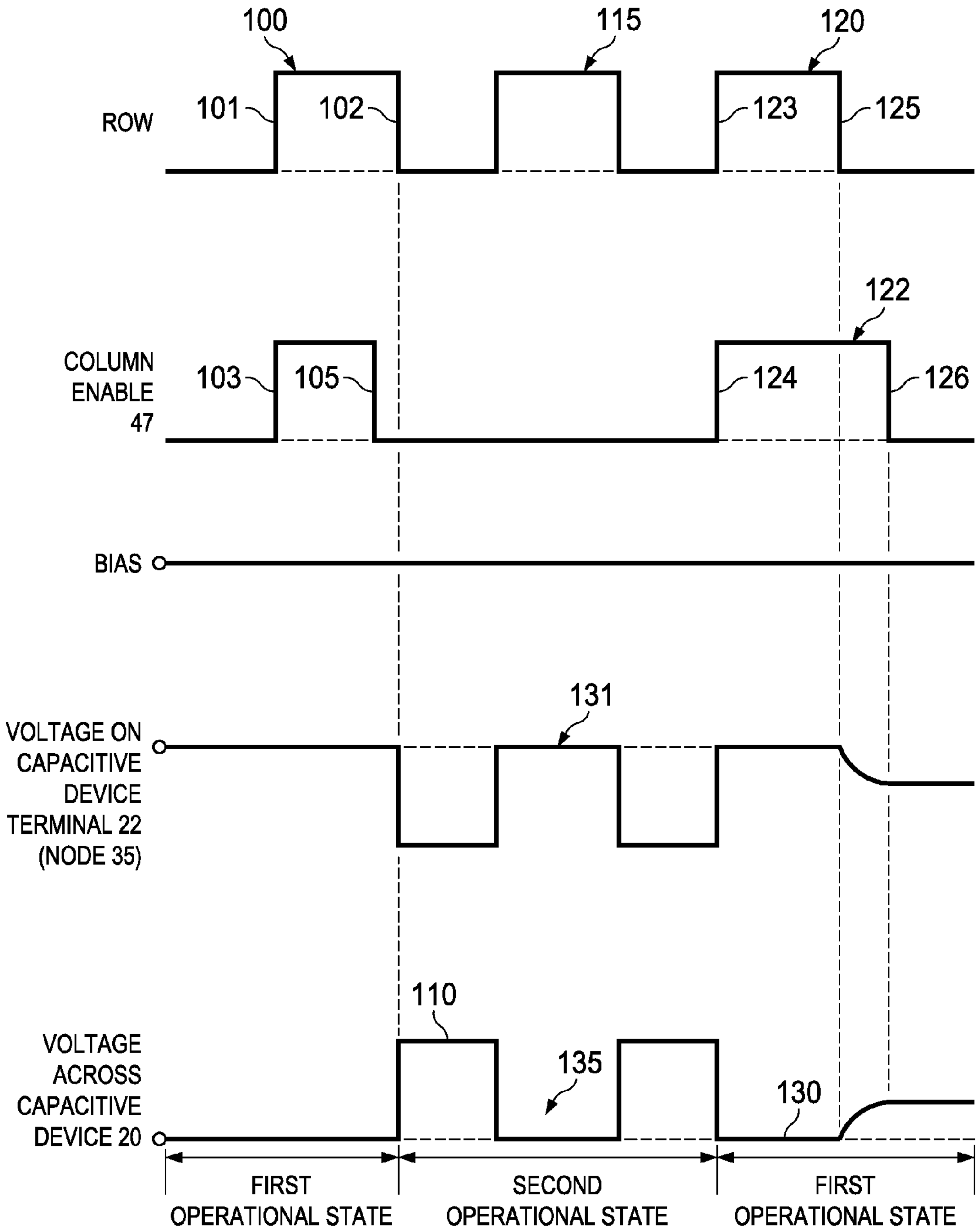
FIG. 3 shows a timing diagram illustrating the operation of the drive circuit of FIG. 2.

The operation of capacitor selection circuit 50 of FIG. 2 will now be explained with regard to the timing diagrams of FIG. 3. The operation of the capacitor selection circuit 50 will be explained to change the operational state of the capacitive device 20 from one state to another and then back to the former state. Referring to FIG. 3, three pulses 100, 115, and 120 are shown on the row line. The first row pulse 100, along with other signals, causes the capacitive device 20 to change operational states from a first operational state to a second operational state. The third row pulse 120 causes the operational state of the capacitive device 20 to change back to the first state. The middle row pulse 115 does not cause a change in operational state to occur (the device 20 remains in the second operational state) due to an absence of a column pulse. The bottom trace in FIG. 3 depicts the voltage across the capacitive device 20 and is labeled with the operational states. Up to the falling edge 102 of row pulse 100, the voltage across the capacitive device 20 is at a low voltage state (e.g., 0 volts differential) and the operational state is the first operational state. Upon occurrence of falling edge 102, the voltage across the capacitive device 20 jumps to a high enough voltage 110 so as to cause the capacitive device 20 to change states to the second operational state. This process is explained in greater detail below.

The COLUMN ENABLE signal 47 is forced high at rising edge 103 commensurate with the rising edge 101 of row pulse 100. The high state of the row voltage 25 causes transistor 32 to turn on. The high state of the COLUMN ENABLE signal 47 turns on transistor 42 for the column. At this time, with both the voltage on row line 25 and the COLUMN ENABLE signal 47 at a high state, both transistors 32 and 42 are in their "on" state. With column enable transistor 42 turned on, the voltage on the column line 27 becomes the COLUMN VOLTAGE 45 from the drain of transistor 42. Then, as transistor 32 has been turned on due to the voltage on row line 25, the column voltage is also forced on to node 35 and thus the terminal 22 of capacitive device 20.

In at least one embodiment, the BIAS voltage connected to terminal 21 of capacitive device 20 is ground (0 volts). The COLUMN VOLTAGE 45 is also ground (0 volts) when both transistors 32 and 42 are turned on for a COLUMN VOLTAGE 45 of 0 V. The voltage on node 35 and thus across the capacitive device 20 is 0 volts. This voltage (0 V) is insufficient to cause the capacitive device 20 to transition to its second operational state. Thus, the capacitive device 20 remains in the first operational state during row pulse 100 as illustrated in the bottom trace in FIG. 3.

The COLUMN ENABLE signal 47 pulse ends with falling edge 105 which occurs before the falling edge 102 of the row pulse 100. The low level for COLUMN ENABLE signal 47 forces transistor 42 to turn off. Once the column enable transistor 42 turns off at falling edge 105, the column line 27 floats. At this point, the row voltage is still high and thus the transistor 32 remains on. The voltage across capacitor 34 is the difference between the row voltage and the voltage on node 35. In some embodiments, for example, the high state for the row voltage is 10 volts and the node 35 voltage with transistor 42 on is 0 volts. The voltage across capacitor 34 in this example is 10 volts.

Then, when the falling edge 102 of the row pulse occurs, transistor 32 turns off. At this point, both transistors 32 and 42 are off, the column line 27 is floating and the row voltage just transitioned from a higher voltage (e.g., 10 volts) to a lower voltage (e.g., 0 volts). As such, the voltage on terminal 34*a* of capacitor 34 drops by, for example, 10 volts. The negative differential current in the capacitor 34 causes the voltage on terminal 34*b* of the capacitor, and thus node 35, to also drop by about the same voltage (10 volts). Thus, with the voltage on node 35 starting at 0 volts just prior to the row pulse falling edge 102 occurring, the voltage on node 35 drops to a negative 10 volts (−10 volts) so as to maintain the same voltage differential across capacitor 34 as the drop in the row voltage.

With the node 35 voltage thus dropping to a much lower level and the BIAS voltage remaining fixed, the absolute voltage across the capacitive device 20 increases as shown at 110 in FIG. 3. This higher voltage level 110 preferably exceeds a threshold voltage associated with the capacitive device 20 to cause the device to transition from the first operational state to the second operational state (e.g., from an off state to an on state). The higher absolute voltage level 110 on the capacitive device remains fixed and the capacitive device 20 remains in the second operational state despite the absence of a row or column voltage.

A feature of the embodiments described herein is that the capacitive device 20 begins to transition to its second operational state (e.g., an "on" state) upon the occurrence of the falling edge 102 of the row pulse. Some capacitive devices 20 may transition between operational states relatively slowly compared to the speed of the electrical signals in the circuitry driving such devices. Thus, the falling edge 102 of the row pulse may put in motion a transition of the capacitive device 20 from the first operational state to the second operational state, but the capacitive device 20 may not complete its transition to the second operational state for some period of time after occurrence of failing edge 102. By the time the transition to the second operational state as completed, the drive circuitry may already be addressing a different row in the system (see FIG. 1). As such, the drive circuitry need not wait for a capacitive device 20 to transition to the second operational state before exiting that row and moving on to a different row.

At row pulse 115, the absence of a corresponding column pulse causes the operational state of the capacitive device 20 to remain in its present state (i.e., the second operational state in the example of FIG. 3). The voltage on node 35 jumps back up to its baseline level at 131 and the voltage across the device also drops at 135 for the duration of the row pulse 115. The reaction of the capacitive device 20 to change operational states, however, may be slower than the duration of the row pulses. If so, the voltage across the capacitive device 20 is not low long enough for the capacitive device 20 to actually change states, The capacitive device 20 remains in its second operational state as shown in FIG. 3 until row pulse 120 occurs. At that point in time, the row voltage and COLUMN ENABLE signal 47 become high which cause both transistors 32 and 42 to turn on. As before, the COLUMN VOLTAGE 45 (e.g., ground) is forced on to node 35. At that point, the voltage across the capacitive device 20 is the difference between the BIAS voltage and the node 35 voltage. In some embodiments as noted above, the BIAS voltage is ground as well as the node 35 voltage with both transistors 32 and 42 being on. Thus, the voltage difference across the capacitive device 20 drops from its higher level at 110 to a lower level at 130. The lower level 130 is less than the threshold noted above that caused the transition to the second operational state, and may be less than a second lower threshold that will prompt a transition back to the first operational state. That is, a pair of thresholds may be associated with the capacitive device 20 to provide a hysteresis effect—a higher threshold must be exceeded by the voltage across the capacitive device 20 to cause a transition from the first to the second operational state, but the voltage must fall below a lower threshold to cause a transition back to the first operational state.

As can be seen in FIG. 3, the COLUMN ENABLE signal 47 has a pulse 122 that begins generally commensurate with the beginning of row pulse 120. COLUMN ENABLE signal pulse 122 has a leading edge 124 timed to occur with the leading edge 123 of row pulse 120. However, this time the falling edge 126 of the COLUMN ENABLE signal pulse occurs after the falling edge 125 of the row pulse. When row pulse falling edge 125 occurs, transistor 32 turns of thereby isolating the column line 27 from node 35. The voltage on node 35 is 0 volts at this point because the COLUMN VOLTAGE 45 is 0 in some embodiments and transistor 42 is still on. The voltage on terminal 34*a* of capacitor 34 goes to 0 volts as the row voltage drops back to its low state. Thus, the voltage across capacitor 34 is 0 volts. The voltage across capacitive device 20 is also 0 volts which forces the operational state of the device back to the first operational state. When transistor 42 turns off upon the falling edge 126 of the COLUMN ENABLE signal pulse, the voltage on node 35 remains at 0 and thus the voltage across the capacitive device 20 also remains at 0 thereby causing the capacitive device 20 to remain in the first operational state (e.g., off).

The embodiments described herein permit individual capacitive devices 20 in a given row being addressed to be separately controlled apart from the other capacitive devices in the same row. That is, a capacitive device that is presently in a first operational state (e.g., off) can remain in that state without regard to how other capacitive devices in the same row are being controlled. Further, a capacitive device that is presently in the second operational state (e.g., on) can remain in that state without regard to how other capacitive devices in the same row are being controlled. Further still, a capacitive device that is presently in a first operational state (e.g., off)

can be transitioned to the second operational state without regard to how other capacitive devices in the same row are being controlled. Finally, a capacitive device that is presently in a second operational state (e.g., on) can be transitioned to the first operational state without regard to how other capacitive devices in the same row are being controlled. In sum, in a given row, a capacitive device that is, for example, on can remain on (without first being turned oft). A capacitive device that is off can remain off. A capacitive device that is off can be turned on and a capacitive device that is on can be turned off. And each capacitive device 20 can be so controlled independently of all other capacitive devices in that same row.

Second Embodiment of Capacitor Selection Circuit

Figure 4:
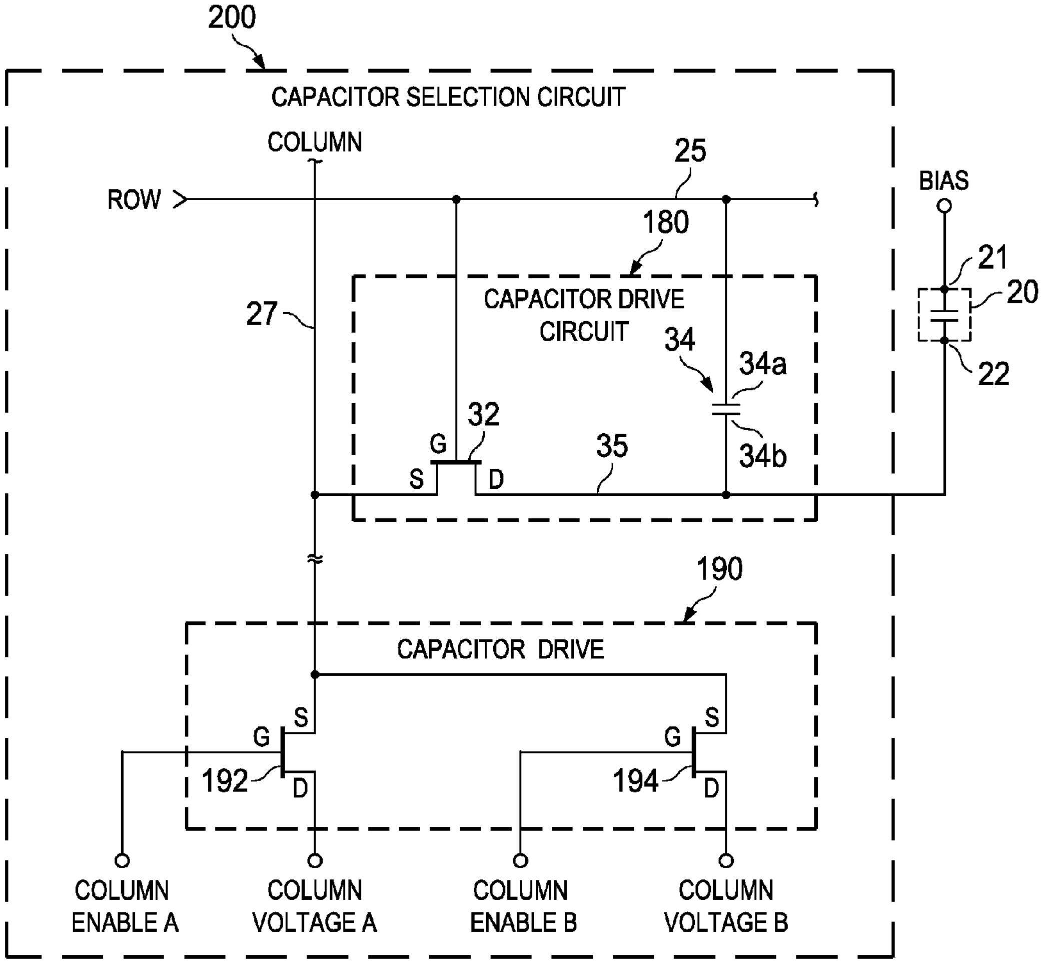
FIG. 4 shows a drive circuit for driving each capacitive device in accordance with another embodiment of the invention.

FIG. 4 illustrates another embodiment of a capacitor drive circuit 200 that controls the voltage applied to and thus the operational state of an associated capacitive device 20. The capacitor drive circuit 200 of FIG. 4 is similar in some respects to the capacitor drive circuit 50 of the embodiment of FIG. 2. A difference between the two circuits is that whereas the column drive circuit 40 of FIG. 2 includes a single transistor (transistor 42), the column drive circuit 190 in the example of FIG. 4 includes two transistors—transistors 192 and 194 as shown. With the column drive circuit 40 of FIG. 2, transistor 42 causes the column line 27 to either float (if transistor 42 is off) or be pulled to the COLUMN VOLTAGE 45 (if transistor 42 is on). The column drive circuit 200 of FIG. 4, however, permits a variable voltage to be imposed on the column line 27 and thus node 35. The variable voltage on node 35 is applied to terminal 22 of the capacitive device 22 and thus the voltage across the capacitive device is also variable.

Each of the transistors 192 and 194 of the capacitor drive circuit 190 has a gate (G), drain (D), and source (S) as indicated on FIG. 4. The gate of each transistor receives a COLUMN ENABLE signal—COL EN A for transistor 192 and COL EN B for transistor 194. Thus, whereas the column drive circuit 40 of FIG. 2 only uses a single COLUMN ENABLE signal, the column drive circuit 190 uses two enable signals. Each enable signal in the column drive circuit 190 of FIG. 4 turns on or off its respective transistor 192 and 194. The drain (D) of each transistor 192, 194 is tied to particular voltage. The drain of transistor 192 is tied to COLUMN VOLTAGE A and the drain of transistor 194 is tied to COLUMN VOLTAGE B. The two column voltages preferably are different. For example, COLUMN VOLTAGE A may be ground and COLUMN VOLTAGE B may be a higher voltage such as 10 V. The variable voltage referred to above is created by column drive circuit 190 and specifically, as will be explained below, by the amount of time the COL EN A and B signals are pulsed as well as the relative timing of falling edges of the COL EN A and COL EN B signals and a falling edge of a row pulse on the row line.

Figure 5:
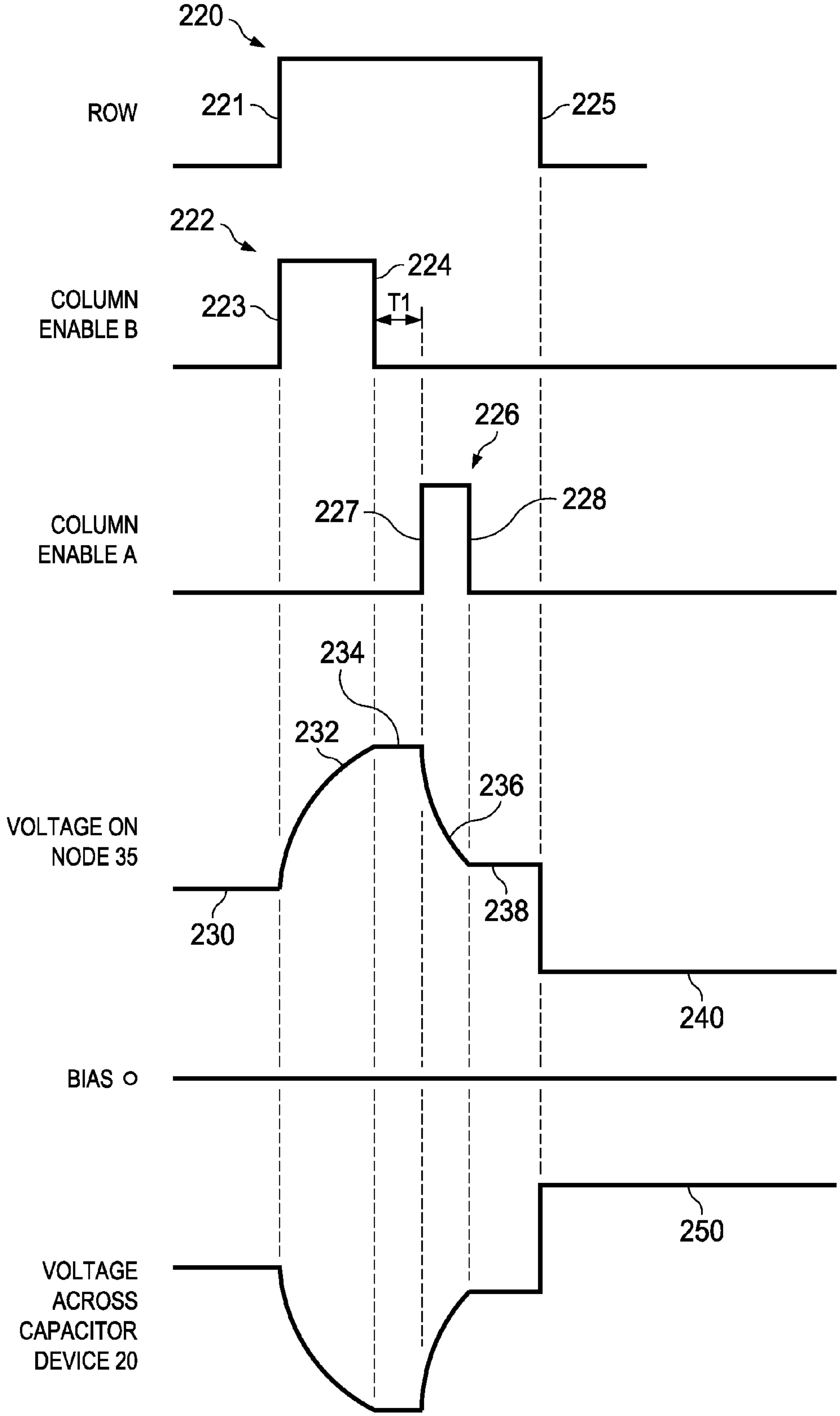
FIG. 5 shows a timing diagram illustrating the operation of the drive circuit of FIG. 4.

FIG. 5 shows a timing diagram that illustrates the operation of the capacitor drive circuit 200 of FIG. 4. The timing traces in FIG. 5 include the row voltage, the COL EN B signal, COL EN A signal, the voltage on node 35 (which is also the voltage on terminal 22 of the capacitive device 20), the BIAS voltage, and the voltage across capacitive device 20. The row voltage in FIG. 5 shows a pulse 220 occurring between rising edge 221 and falling edge 225. The COL EN B signal pulses at 222 followed by a pulse 226 of the COL EN A signal. In this example, COLUMN VOLTAGE B is a higher voltage than the COLUMN VOLTAGE A. Once the rising edge 221 of the row pulse occurs, transistor 32 turns on. Generally simultaneously, transistor 194 also turns on as a result of the COL EN B signal going high at rising edge 223. At this point, both transistors 32 and 194 are on and transistor 192 is off. In this embodiment, transistors 192 and 194 are preferably never both on simultaneously.

With transistor 194 on, the voltage on the column line 27 and thus node 35 begins to increase at an exponential rate from a low voltage at 230 toward the COLUMN VOLTAGE B voltage as illustrated at 232 in FIG. 5. The exponential rate increase of the node 35 voltage is in accordance with an "RC" time constant. The resistance (R) is the resistance of the traces along node 35 and the column line 27 combined with the internal on resistance of transistors 32 and 194. The capacitance (C) is the combined capacitance of capacitor 34, capacitive device 20, and minor trace and transistor capacitances. The voltage increases exponentially as shown until the COL EN B signal goes low at failing edge 224. At that point, transistor 194 turns off (and transistor 192 remains off) and the voltage on node 35 is "frozen" at the level (234) present on node 35 when transistor 194 turned off.

The voltage on node 35 remains at level 234 until the transistor 192 is turned by COL EN A pulse 226. Upon the occurrence of the rising edge 227 of the COL EN A pulse, the voltage on node 35 begins falling at an exponential rate 236 toward the voltage level of COLUMN VOLTAGE A (e.g., 0 V). The decay is in accordance with an RC time constant. The resistance (R) is the resistance of the traces along node 35 and the column line 27 combined with the internal on resistance of transistors 32 and 192. The capacitance (C) is the combined capacitance of capacitor 34, capacitive device 20, and minor trace and transistor capacitances.

The decay of voltage on node 35 proceeds as shown at 236 until the occurrence of the falling edge 228 of the COL EN A pulse. At that point, both transistors 192 and 194 again are off and the voltage on node 35 remains at a fixed level 238 until the occurrence of the falling edge 225 of the row pulse. As before, the voltage on node 35 drops by an amount equal to the drop in the voltage on the row line 25.

The final voltage level 240 of node 35 thus is a function of voltage level 238 and the voltage drop on the row one. The voltage level 238 in turn is a function of the relative timing of the row and column enable pulses. By adjusting the widths of the column enable pulses 222 and 226 and the amount of time T1 between the pulses, any desired voltage 240 can be generated on node 35. Because the voltage across the capacitive device 20 is the difference between the BIAS voltage, which may remain fixed, and the node 35 voltage, which can be precisely controlled as explained above, the voltage across capacitive device 20 can be varied as desired. The bottom trace in FIG. 5 illustrates the voltage across the capacitive device 20 culminating in voltage 250. Logic (not shown) controls the assertion and thus the timing of the row pulse and COL EN A and B signals.

Third Embodiment of Capacitor Selection Circuit

Figure 6:
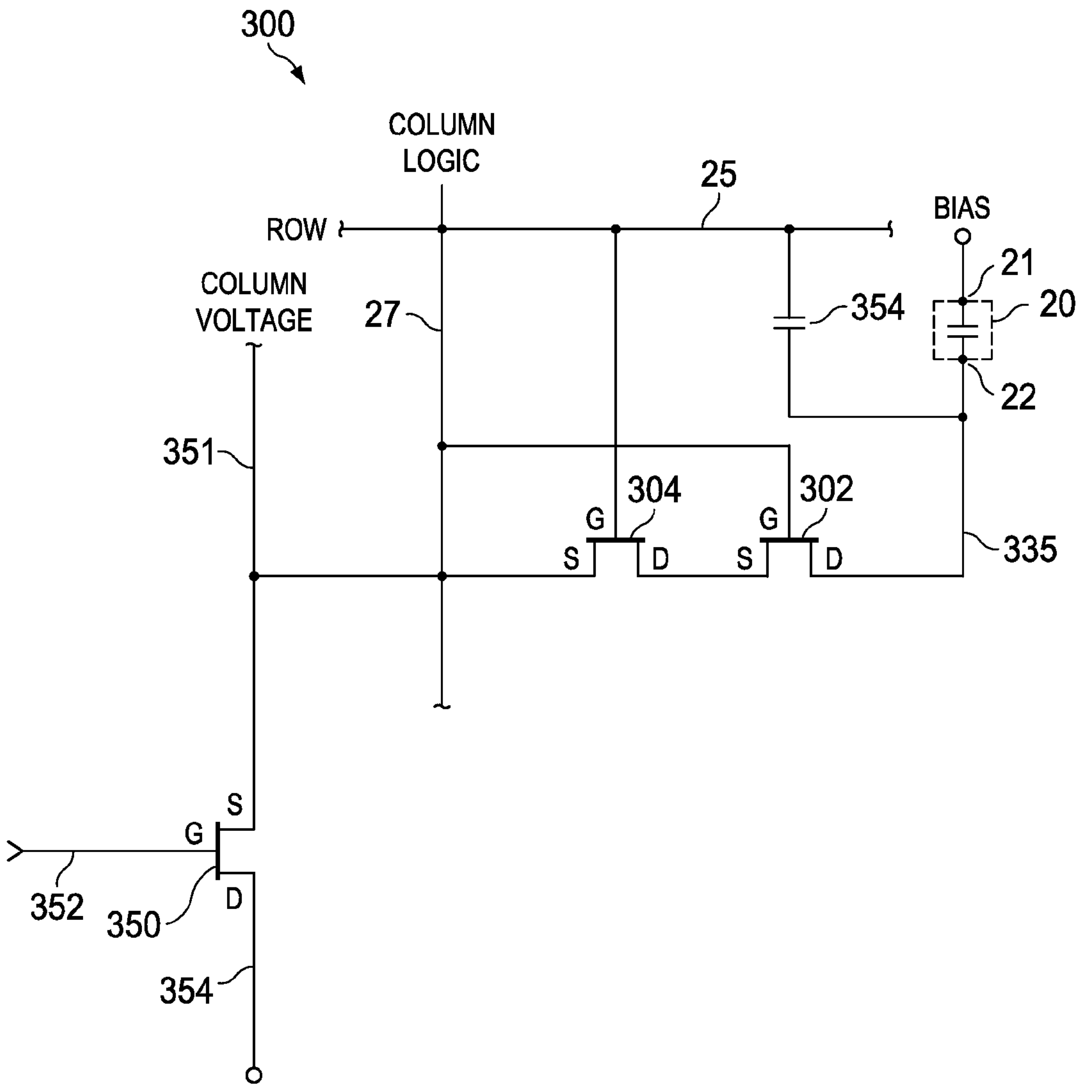
FIG. 6 shows a drive circuit for driving each capacitive device in accordance with yet another embodiment of the invention.

FIG. 6 illustrates another embodiment of a circuit 300 for driving a capacitive device 20. The drive circuit 300 of FIG. 6 comprises a pair of FETs 302 and 304 as well as capacitor 334. The FETs are connected in series as shown. The gate of FET 302 is connected to the column logic line 27 and thus the column voltage turns FET 302 on and off. The gate of FET 304 is connected to the row line 25 and thus the row voltage turns FET 304 on and off. In this embodiment, the column logic line 27 does not float; instead, the column line 27 is driven between two voltages (e.g., 0 and a positive voltage sufficient to turn FET 302 on). A column drive FET thus is not needed to drive a FET for the column line as in the previous embodiments. The row and column logic lines 25, 27 are driven by logic or other circuitry (not shown).

For the most part, the timing diagram of FIG. 3 applies to the operation of circuit of FIG. 6. The COLUMN ENABLE signal 47 in FIGS. 2 and 3 is the column line voltage in FIG. 6. The node 35 in FIG. 2 equates to node 335 in FIG. 6.

In operation, both column logic 27 and row 25 lines must be at a high voltage to turn on both FETs 302 and 304 thereby providing a current to equalize the voltage between node 335 and column voltage line 351. PET 350 can be turned on by a control signal 352 (driven by logic not shown) on its gate and the drain of FET 350 is connected to a predetermined voltage such as ground or another desired voltage. With FET 352 turned on, a sufficient gate-enabling voltage level for the row and column lines causes FETS 302 and 304 also to turn on thereby connecting node 335 to a column voltage line 351 and thus to voltage 354 (e.g., ground) through FET 350.

If the column line voltage transitions back to its low state before the row line voltage transitions to its low state (illustrated at 105 in FIG. 3), then FET 302 turns off with FET 304 remaining on. The off state for FET 302 traps the charge at node 335. Then, when the row voltage goes low, the negative displacement through capacitor 334 causes the voltage on node 335 to drop by an amount commensurate with the drop of the row voltage. For example, if the row voltage drops from a high state of 20 V to a low state of 0 V, the voltage on node 335 also drops by 20 V, from 0 V to −20 V. As a result, the voltage across capacitive device 20 increases by 20 V thereby causing the device to transition from one operational state to another. Causing the capacitive device 20 to transition back to its former capacitive state occurs as described previously with the column voltage going low after the row voltage goes low.

The drive circuit 300 of FIG. 6 includes two FETs 302, 304 in series along the current path for the capacitive device 20. This series combination of FETs enables a larger row voltage to be used to operate the capacitive device 20 as each FET 302, 304 is only required to dissipate a portion of the total voltage on terminal 22. The voltage on terminal 22 can come from the row pulse, the column voltage line and/or the bias voltage (e.g. displacement current).

The control signal 352 in drive circuit 300 of FIG. 6, can be used to reduce total power consumption and increase the switching times of the circuit by leaving the FET 350 'on' during the addressing of all the rows, but turning it 'off' during the time that the rows are not being addressed. By having the FET 350 'on' places the higher voltage on the column voltage 351, eliminating the RC time constant delay necessary to charge the column line to a precise voltage between row to row transitions. This architecture works best for a two state (or threshold) device since the RC time constant delay is not nearly as significant for a threshold voltage compared to the delay required to set a precise voltage. By turning the column voltage 351 "off" when the rows are not being addressed removes the current leakage path for terminal 22, which minimizes the need for refresh.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

LIST OF THE REFERENCE NUMBERS OF THE MAJOR COMPONENTS IN THE DRAWINGS

| | |
|---|---|
| 10 | system comprising multiple capacitive devices |
| 20 | capacitive device |
| 21, 22 | terminal |
| 25 | row line |
| 27 | column line |
| 30 | capacitor drive circuit |
| 32 | transistor |
| 34 | capacitor |
| 34a, 34b | terminal |
| 35 | node |
| 40 | column drive circuit |
| 42 | transistor |
| 45 | COLUMN VOLTAGE |
| 47, 47a~47c | COLUMN ENABLE signal |
| 50 | capacitor selection circuit |
| 100 | pulse |
| 101 | rising edge |
| 102 | falling-edge |
| 103 | rising edge |
| 105 | falling edge |
| 110 | high enough voltage |
| 115, 120, 122 | pulse |
| 123, 124 | leading edge |
| 125, 126 | falling edge |
| 130 | lower level |
| 131 | baseline level |
| 135 | level |
| 180 | capacitor drive circuit |
| 190 | column drive circuit |
| 192, 194 | transistor |
| 200 | column drive circuit |
| 220 | pulse |
| 221 | rising edge |
| 222 | pulse |
| 223 | rising edge |
| 224 | falling edge |
| 225 | falling edge |
| 226 | pulse |
| 227 | rising edge |
| 228 | falling edge |
| 230 | tow voltage |
| 232 | exponential rate |
| 234 | level |
| 236 | exponential rate |
| 238 | voltage level |
| 240 | voltage level |
| 250 | voltage |
| 300 | circuit |
| 302, 304 | FET |
| 334 | capacitor |
| 335 | node |
| 350 | FET |
| 351 | column voltage line |
| 352 | control signal |
| 354 | voltage |

What is claimed is:

1. A drive circuit for a capacitive device that comprises a first operational state and a second operational state, said drive circuit comprising:

a first transistor having a gate, a drain, and a source, wherein said gate is coupled to a row line, and one of said source and drain is coupled to a column line;

a capacitor having a first terminal and a second terminal, wherein said first conductive terminal is coupled to the row line and the second conductive terminal couples to the other of the first transistor's source and drain and also is coupled to the capacitive device; and a second transistor having a gate, a drain and a source, wherein one of said second transistor's drain and source is coupled to said column line, and wherein said second transistor's gate is configured to receive a column enable signal to control said second transistor;

wherein the capacitive device is caused to transition from the first operational state to the second operational state by a row pulse being asserted on the row line and a column pulse asserted on the column enable signal commensurate with the assertion of the row pulse, said column pulse deasserted before the row pulse is deasserted, wherein said capacitive device is caused to transition from the first operational state to the second operational state upon deassertion of the row pulse.

2. The drive circuit of claim 1 wherein the capacitive device is caused to remain in the first operational state by deassertion of the column pulse after deassertion of the row pulse.

3. The drive circuit of claim 1 wherein the capacitive device can be controlled independently of any other capacitive devices associated with same row signal.

4. The drive circuit of claim 3 wherein a capacitive device that is in either of the first or second operational states can be maintained in the first or second operational states, respectively, without regard to how other capacitive devices associated with the same row signal are controlled.

5. The drive circuit of claim 3 wherein a capacitive device that is in either of the first and second operational states can be caused to transition to the other of the first and second operational states without regard to how other capacitive devices associated with the same row signal are controlled.

6. The drive circuit of claim 1 wherein said column line is in a floating state upon deassertion of said row pulse.

7. A drive circuit for a capacitive device that comprises a first operational state and a second operational state, said drive circuit comprising:

a first transistor having a gate, a drain, and a source, wherein said gate is coupled to a row line, and one of said source and drain is coupled to a column line;

a capacitor having a first terminal and a second terminal, wherein said first conductive terminal is coupled to the row line and the second conductive terminal couples to the other of the first transistor's source and drain and also is coupled to the capacitive device; and a transistor circuit coupled to said column line, said transistor circuit comprising a second transistor and a third transistor, each of the second and third transistors having a gate, a drain, and a source;

wherein one of the drain and source of the second transistor is tied to a first voltage and one of the drain and source of the third transistor is tied to a second voltage that is different than the first voltage, and the second transistor's gate is configured to receive a first column enable signal and said third transistor's gate is configured to receive a second column enable signal;

wherein a variable voltage between said first and second voltage is caused to be applied to one terminal of said capacitive device, said variable voltage is a function of at least the relative timing of falling edges of said first and second column enable signals and a falling edge of a row pulse on said row line.

8. The drive circuit of claim 7 wherein the first voltage is ground and the second voltage is a positive voltage.

9. The drive circuit of claim 7 wherein the variable voltage is a function of at least the amount of time the first and second column enable signals are pulsed and the relative timing of the first and second column enable signal falling edges and the falling edge of the row pulse.

10. The drive circuit of claim 7 wherein the variable voltage increases at an exponential rate during a pulse on said first column enable signal and decreases at an exponential rate during a pulse on said second column enable signal.

11. The drive circuit of claim 7 wherein said variable voltage drops upon occurrence of the falling edge of said row pulse.

12. The drive circuit of claim 11 wherein said capacitive device transitions from the first operational state to the second mechanical state upon said voltage drop occurring on the falling edge of said row pulse.

13. A drive circuit for a capacitive device that comprises a first operational state and a second operational state, said drive circuit comprising:

a first transistor having a gate, a drain, and a source, wherein said gate is coupled to a row line;

a second transistor having a gate, a drain and a source, wherein one of said second transistor's drain and source is coupled to one of the source and drain of the first transistor thereby coupling the first and second transistors in series, and wherein the gate of the second transistor is coupled to said column line;

a capacitor having a first terminal and a second terminal, wherein said first conductive terminal is coupled to the row line and the second conductive terminal couples to the other of the second transistor's source and drain and also is coupled to the capacitive device; and wherein the capacitive device is caused to transition from the first operational state to the second operational state by a row pulse being asserted on the row line and a column pulse asserted on the column enable signal commensurate with the assertion of the row pulse, said column pulse deasserted before the row pulse is deasserted, wherein said capacitive device is caused to transition from the first operational state to the second operational state upon deassertion of the row pulse.

* * * * *